(12) United States Patent
Park et al.

(10) Patent No.: US 12,150,287 B2
(45) Date of Patent: Nov. 19, 2024

(54) DISPLAY APPARATUS

(71) Applicant: LG DISPLAY CO., LTD., Seoul (KR)

(72) Inventors: Chanhyeok Park, Paju-si (KR); Heeseok Noh, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 223 days.

(21) Appl. No.: 17/966,138

(22) Filed: Oct. 14, 2022

(65) Prior Publication Data

US 2023/0209784 A1 Jun. 29, 2023

(30) Foreign Application Priority Data

Dec. 28, 2021 (KR) .................. 10-2021-0189133

(51) Int. Cl.
*H05K 7/20* (2006.01)
*H10K 50/87* (2023.01)
*H10K 59/12* (2023.01)

(52) U.S. Cl.
CPC ......... *H05K 7/20963* (2013.01); *H10K 50/87* (2023.02); *H10K 59/12* (2023.02)

(58) Field of Classification Search
CPC .... G06F 1/1637; G06F 1/1652; G06F 1/1656; G06F 1/1601; G06F 1/1616; G06F 3/0412; G06F 1/1641; G06F 1/20; G06F 2203/04102; G06F 1/1626; H10K 50/87; H10K 59/8794; H10K 2102/311; H10K 59/40; H10K 50/84; H10K 59/12; G02F 1/133305; G02F 2202/28; G02F 1/133382; G02F 1/0102; G02F 1/1335; G02F 2201/07; G09F 9/301; G09F 9/335; H04M 1/0266; H04M 1/0268; H04M 1/026; Y10S 345/905; H05K 7/20963
See application file for complete search history.

(56) References Cited

U.S. PATENT DOCUMENTS

| | | | | |
|---|---|---|---|---|
| 9,482,885 | B2 * | 11/2016 | Joo | G02F 1/1533 |
| 10,957,875 | B2 * | 3/2021 | Song | H10K 59/8722 |
| 11,449,095 | B2 | 9/2022 | Lee | |
| 2020/0295303 | A1 * | 9/2020 | Nishimura | H10K 50/8445 |
| 2021/0034121 | A1 * | 2/2021 | Lee | G06F 1/203 |
| 2021/0256882 | A1 * | 8/2021 | Kim | G06F 1/1656 |
| 2021/0280806 | A1 * | 9/2021 | Park | H10K 59/8791 |
| 2021/0368621 | A1 * | 11/2021 | Yoo | G06F 1/1686 |

(Continued)

FOREIGN PATENT DOCUMENTS

| | | |
|---|---|---|
| KR | 10-2021-0026441 A | 3/2021 |
| KR | 10-2021-0086844 A | 7/2021 |

*Primary Examiner* — Michael A Matey
(74) *Attorney, Agent, or Firm* — POLSINELLI PC

(57) ABSTRACT

A display apparatus includes display panel configured to display an image from one side of the display panel; a first member disposed at another side of the display panel; a first adhesive layer disposed at an upper portion of the first member; a second member disposed at an upper portion of the first adhesive layer; and a first heat-dissipation layer disposed at an upper portion of the second member, wherein the second member includes a first area including a central area of the second member, and a second area including at least three outer edges of the second member, wherein the second member has a vertical dimension or a shape in the first area different from a vertical dimension or a shape of the second member in the second area.

15 Claims, 6 Drawing Sheets

(56) References Cited

U.S. PATENT DOCUMENTS

| | | | | |
|---|---|---|---|---|
| 2021/0373604 A1* | 12/2021 | Shin | .................. | G06F 1/1637 |
| 2021/0384457 A1* | 12/2021 | Jang | .................. | H10K 59/8794 |
| 2022/0011815 A1* | 1/2022 | Min | .................. | G06F 1/1616 |
| 2022/0061168 A1* | 2/2022 | Shin | .................. | H10K 59/8722 |
| 2022/0129040 A1* | 4/2022 | Kim | .................. | H04M 1/0268 |
| 2022/0155821 A1* | 5/2022 | Kim | .................. | G06F 1/1618 |
| 2022/0317731 A1* | 10/2022 | Kim | .................. | G09F 9/301 |
| 2022/0322583 A1* | 10/2022 | Shin | .................. | G06F 1/1652 |
| 2022/0375880 A1* | 11/2022 | Kim | .................. | G06F 3/04164 |
| 2022/0399375 A1* | 12/2022 | Wang | .................. | H01L 27/1218 |
| 2023/0045544 A1* | 2/2023 | Shin | .................. | G02F 1/133305 |
| 2023/0059283 A1* | 2/2023 | Park | .................. | G06F 1/1637 |
| 2023/0062254 A1* | 3/2023 | Jang | .................. | H10K 59/87 |
| 2023/0172037 A1* | 6/2023 | Wei | .................. | F21V 29/503 257/40 |
| 2024/0188386 A1* | 6/2024 | Zhang | .................. | H10K 59/8794 |
| 2024/0215354 A1* | 6/2024 | Kim | .................. | H10K 59/131 |

* cited by examiner

DISPLAY APPARATUS

CROSS-REFERENCE TO RELATED APPLICATION

This application claims the priority of Korean Patent Application No. 10-2021-0189133 filed on Dec. 28, 2021, which is hereby incorporated by reference in its entirety.

BACKGROUND

Field of the Disclosure

The present disclosure relates to a display apparatus, and more particularly, to a display apparatus capable of improving a heat-dissipation function and reducing a thickness.

Description of the Background

A display apparatus is used in a variety of forms and manners in televisions, monitors, smart phones, tablet PCs, notebooks, wearable apparatuses, and the like. Among the display apparatuses used in the various forms and manners, an organic light-emitting display apparatus (OLED) is developed.

The organic light-emitting display apparatus has a self-emissive element in which the element itself generates light, and thus a separate light source is not required, thereby implementing a display apparatus which is bendable or has various designs. Further, the organic light-emitting display apparatus may be thinner than a liquid crystal display apparatus (LCD) and has advantages of excellent color rendering, a large viewing angle, a high contrast ratio, and a fast response speed, thereby realizing high-definition video. Thus, an application range thereof is gradually increasing.

The organic light-emitting display apparatus includes a display area for displaying an image and a non-display area formed along an outer edge of the display area. Additional components may be disposed in the non-display area, or various connecting components such as a flexible circuit board for connecting the additional components to each other may be disposed in the non-display area.

A thickness and a width of the display apparatus may increase as the apparatus includes a plurality of additional parts. As the thickness and the width of the display apparatus increase, a design and a portability of the apparatus may be poor. Thus, research on schemes to reduce the thickness and the width of the display apparatus while maintaining rigidity thereof is in progress.

Further, when the display apparatus operates, heat may be generated in a driver integrated circuit, etc. Accordingly, a heat-dissipation layer may be disposed on a rear surface of a display panel to emit or dissipate the heat from the driver integrated circuit, etc. Research is being conducted on a scheme to increase efficiency of the heat-dissipation.

A thickness of the heat-dissipation layer may be increased to effectively dissipate the heat of the driver integrated circuit. However, an overall thickness of the display apparatus increases as much as the thickness of the added heat-dissipation layer, thereby increasing a bezel area.

Further, after a manufacturing or bending process of the display panel is performed, it is difficult to additionally attach the heat-dissipation layer thereto due to a nature of a process. Thus, it may be difficult to effectively dissipate the heat from the driver integrated circuit.

The above information disclosed in this Background section is only for enhancement of understanding of the background of the described technology and therefore it may contain information that does not form prior art that is already known to a person of ordinary skill in the art.

SUMMARY

Accordingly, the present disclosure is to provide a display apparatus with a new structure that is able to improve heat-dissipation characteristics without increasing the thickness of the display apparatus.

More specifically, the present disclosure is to provide a display apparatus capable of maintaining rigidity and improving a heat-dissipation function and grounding performance without increasing an overall thickness of each of a display module and thus a display apparatus.

The present disclosure is not limited to the above-mentioned features. Other advantages of the present disclosure that are not mentioned may be understood based on following descriptions, and may be more clearly understood based on aspects of the present disclosure. Further, it will be easily understood that advantages of the present disclosure may be realized using means shown in the claims and combinations thereof.

In an aspect of the present disclosure, a display apparatus includes a display panel configured to display an image from one surface of the display panel; a first member disposed at another surface of the display panel; a first adhesive layer disposed at an upper portion of the first member; a second member disposed at an upper portion of the first adhesive layer; and a first heat-dissipation layer disposed at an upper portion of the second member, wherein the second member includes a first area including a central area of the second member, and a second area including at least three outer edges of the second member, and wherein the second member has a vertical dimension or a shape of the second member in the first area is different from a vertical dimension or a shape of the second member in the second area.

In another aspect of the present disclosure, a display apparatus includes a display panel configured to display an image from one surface of the display panel; a first member disposed at another surface of the display panel; a first adhesive layer disposed at an upper portion of the first member; a second member disposed at an upper portion of the first adhesive layer; and a first heat-dissipation layer disposed at an upper portion of the second member, wherein the first heat-dissipation layer is porous and includes copper, wherein the second member includes a first area including a central area of the second member, and a second area including an outer edge of the second member, wherein a thickness and a shape of the second member in the first area are different from a thickness and a shape of the second member in the second area, wherein the second member has rigidity greater than rigidity of the first heat-dissipation layer, and includes a metal.

In the display apparatus according to the present disclosure, the metal layer having pores acts as a heat-dissipation member, and the metal layer with rigidity greater than that of the heat-dissipating member may act as the rigid member. Thus, the rigidity may be maintained and the heat-dissipation performance may be improved without increasing the overall thickness of the display apparatus.

In addition, according to the present disclosure, the heat-dissipation member extends to a side surface of the display panel via laser trimming, thereby improving the grounding performance.

Effects of the present disclosure are not limited to the above-mentioned effects, and other effects as not mentioned will be clearly understood by those skilled in the art from following descriptions.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain principles of the disclosure.

Figure 1:
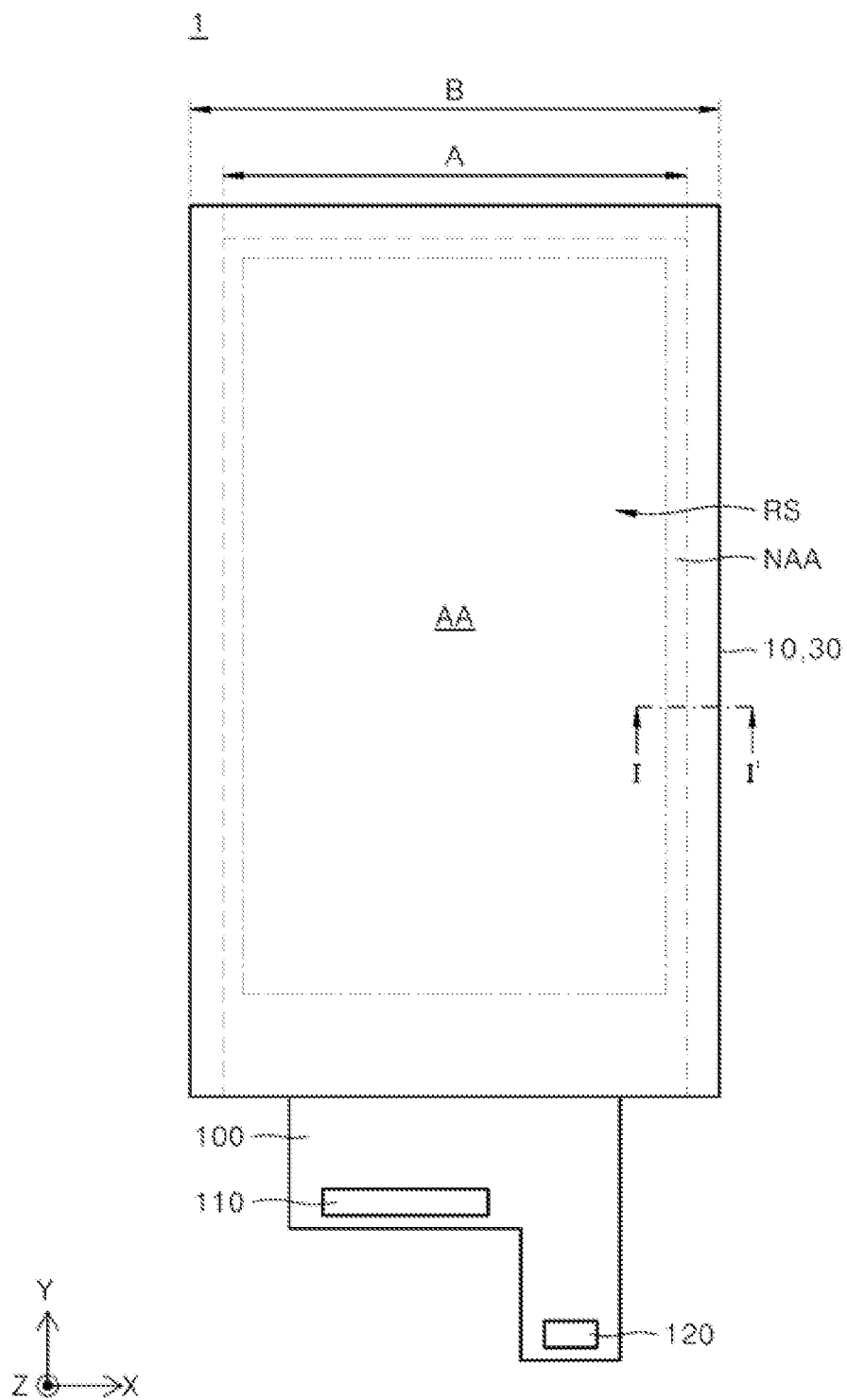
FIG. 1 is a plan view of a display apparatus according to an aspect of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Advantages and features of the present disclosure, and a method of achieving the advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer, or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various aspects of the present disclosure may be partially or entirely combined with each other, and may be technically associated with each other or operate with each other. The aspects may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "display apparatus" may include, in a narrow sense, a display apparatus including a liquid crystal module (LCM), an organic light-emitting diode (OLED) module, or a quantum dot (QD) module including a display panel and a driver for driving the display panel. Moreover, the display apparatus may include, in a broad sense, a laptop computer, a television, a computer monitor, an automotive apparatus or an equipment display for a vehicle, a set electronic apparatus, a set apparatus or a set apparatus including a complete product or a final product including the LCM, the OLED module, or the QD module.

Therefore, the display apparatus in accordance with the present disclosure may include, in the narrow sense, a display apparatus itself including, for example, the LCM, the OLED module, QD module, etc., and may include, in a broad sense, the set apparatus as an application product or an end-user apparatus including a complete product or a final product including the LCM, the OLED module, or the QD module.

Moreover, in some cases, the LCM, OLED module, or QD module composed of the display panel and the driver may be expressed as "display apparatus" in a narrow sense. The electronic apparatus as a complete product including the LCM, OLED module or QD module may be expressed as "set apparatus" in a broad sense. For example, the display apparatus in the narrow sense may include a display panel such as a liquid crystal panel, an organic light-emitting display panel, or a quantum dot display panel, and a source PCB as a controller for driving the display panel. The set apparatus in the broad sense may include a display panel such as a liquid crystal panel, an organic light-emitting display panel, or a quantum dot display panel, a source PCB as a controller for driving the display panel, and a set PCB as a set controller that is electrically connected to the source PCB and controls the set apparatus.

As used herein, the display panel may be of any type of the display panels such as a liquid crystal display panel, an organic light emitting diode (OLED) display panel, a quantum dot (QD) display panel, and an electroluminescent display panel, etc. The display panel used in the present disclosure may be not limited to a specific display panel including a flexible substrate for the OLED display panel and an underlying back plate support structure and having a bendable bezel. Moreover, the display panel used in the display apparatus according to an aspect of the present disclosure is not limited to a shape or a size of the display panel.

More specifically, when the display panel is embodied as the organic light emitting diode (OLED) display panel, the display panel may include a plurality of gate lines and data lines, and pixels respectively formed in areas where the gate lines and the data lines intersect with each other. Moreover, the display panel may be configured to include an array including a thin-film transistor as an element for selectively applying a voltage to each pixel, an organic light-emitting element layer on the array, and an encapsulation substrate or an encapsulation layer disposed on the array to cover the organic light-emitting element layer. The encapsulation layer protects the thin-film transistor and the organic light-emitting element layer from external impact, and may prevent moisture or oxygen from penetrating into the organic light-emitting element layer. Moreover, the light emitting layer formed on the array may include an inorganic light emitting layer, for example, a nano-sized material layer, or a quantum dot.

Hereinafter, various configurations of a display apparatus capable of improving a heat-dissipation effect without increasing an overall thickness of the apparatus will be described in detail.

Figure 2:
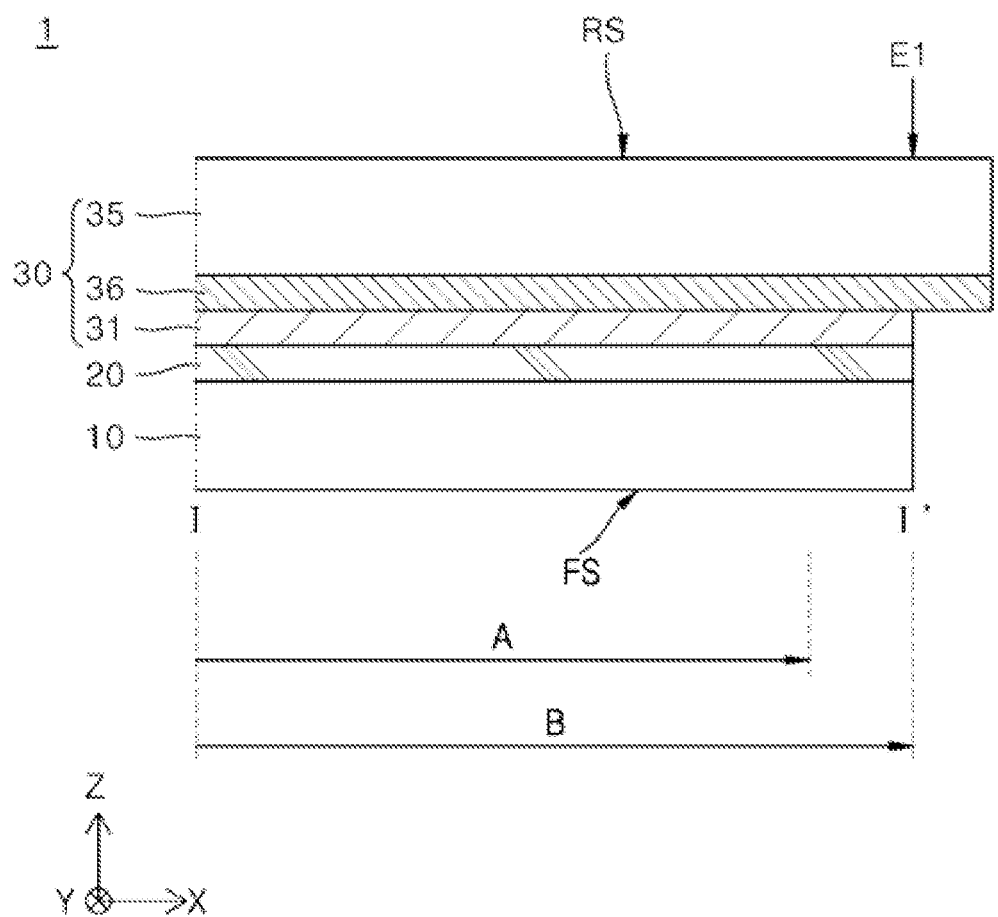
FIG. 2 is a cross-sectional view taken along cutting line I-I' in FIG. 1.

FIG. 1 is a plan view of a display apparatus according to an aspect of the present disclosure. FIG. 2 is a cross-sectional view taken along cutting line I-I' of FIG. 1.

As used herein, and as show in FIGS. 1 and 2, a direction toward a rear surface RS and an upper side refers to a Z-axis direction, and a direction toward a front surface FS and a bottom side (or lower surface) refers to a −Z-axis direction. In one example, FIG. 1 shows a rear surface RS of the display apparatus.

With reference to FIGS. 1 and 2, a display apparatus 1 may be configured to include a display panel 10, a first member 20, and a heat-dissipating structure 30. Although not shown in the drawing, a cover member may be attached to the display apparatus 1 via a fixing member.

The display panel 10 may include a display substrate made of polymer or plastic such as polyimide (PI), or glass. The display panel 10 may include a display area AA for displaying an image and a non-display area NAA. A plurality of sub-pixels for displaying an image and a driving circuit for driving the plurality of sub-pixels may be disposed in the display area AA. A pixel array may include the plurality of sub-pixels and the driving circuit. The non-display area NAA may be formed to surround the display area and may be an area where no image is displayed.

A bezel may refer to the non-display area NAA surrounding the display area AA in the display apparatus 1. The non-display area NAA and the bezel of the display apparatus 1 may be the same area. A circuit board 100, a driver integrated circuit 110, and a connector 120 connected to an external apparatus may be disposed in the non-display area NAA. The connector 120 may be a current connector. However, the present disclosure is not limited to the terminology.

In one aspect of the present disclosure, a chip-on film (COF) in which the driver integrated circuit 110 is directly mounted on the display panel 10 may be employed. However, the present disclosure is not limited thereto. The circuit board 100 may be embodied as a flexible printed circuit board (FPCB). The circuit board 100 may be directly mounted or attached to the display panel 10.

One side (or one end) of the circuit board 100 may be attached to the non-display area NAA of the display panel 10, and the other side (or the other end) may be then bent to be disposed on a rear surface of the display panel 10 such that a size of the non-display area NAA visible in a frontward direction may be reduced. Further, after a one end of the display panel 10 on which the circuit board 100 is mounted together with the circuit board 100 is bent to a certain amount, thereby further reducing a size of the non-display area NAA of the display panel 10 visible in the frontward direction.

In another aspect of the present disclosure, in order to reduce a size of the non-display area NAA of the display panel 10 visible in the frontward direction as much as possible, one side (or one end) of the display panel 10 may be bent so as to be disposed on the rear surface of the display panel 10. In the bent state of the circuit board 100, the driver integrated circuit 110 may be disposed on a rear surface of the display substrate.

As a radius of curvature at which the display panel 10 or the circuit board 100 is bent increases, a size of the non-display area NAA of the display panel 10 visible in the frontward direction increases, and an overall thickness of the display apparatus 1 is reduced, thereby reducing a radius of curvature of the circuit board 100.

Although not shown, the pixel array including a thin-film transistor layer and a light-emitting element may constitute an upper portion of the display panel 10. The pixel array includes the plurality of sub-pixels. Each of the plurality of sub-pixels may be an individual unit emitting light. The light-emitting element may be disposed in each of the plurality of sub-pixels.

The driver integrated circuit 110 generates a data signal and a gate control signal based on image data and a timing synchronization signal supplied from an external host driving system. Moreover, the driver integrated circuit 110 may supply the data signal to a data line of each pixel via a display pad, and may supply the gate control signal to a gate driving circuit via the display pad.

Since the driver integrated circuit 110 generates a larger amount of heat, it may be necessary to effectively impart a heat-dissipation effect to the driver integrated circuit 110. For example, the heat from the driver integrated circuit 110 may be effectively dissipated via the heat-dissipating structure 30.

The heat-dissipating structure 30 may be positioned between the display panel 10 and the driver integrated circuit 110 to effectively dissipate the heat generated from the display panel 10 as well as the driver integrated circuit 110. The heat-dissipating structure 30 may be referred to as a cushion plate or a heat-dissipation layer. The present disclosure is not limited to the terminology.

A first member 20 may be disposed at an upper portion (or upper side) of the display panel 10. The first member 20 may be disposed at a bottom surface (or lower surface) of the display substrate constituting the display panel 10 and may supplement rigidity of the display substrate. The first member 20 may be formed to have a certain strength and a certain thickness to supplement the rigidity of the display substrate. The first member 20 may be referred to as a back plate, a support layer, or a first rigid member, etc. The present disclosure is not limited to the terminology.

The heat-dissipating structure 30 may be disposed at an upper portion (or upper side) of the first member 20. The heat-dissipating structure 30 may have a heat-dissipation function and an impact absorption function, and may be configured to include an adhesive layer 31, a second member 36, and a heat-dissipation layer 35. For example, the adhesive layer 31, the second member 36 and the heat-dissipation layer 35 may be sequentially stacked in a direction toward a rear surface RS of the display apparatus 1.

The adhesive layer 31 constitutes the heat-dissipating structure 30, and may adhere the first member 20 and the second member 36 to each other. The adhesive layer 31 may be referred to as an adhesive layer, or an adhesive member, etc. The present disclosure is not limited to the terminology.

The second member 36 may be disposed at an upper portion of the adhesive layer 31. The second member 36 may additionally supplement the rigidity of the display panel 10 as secured via the first member 20. Further, the second member 36 may absorb the heat generated from the display panel 10 and transfer the heat to the heat-dissipation layer 35.

The second member 36 may be embodied as a metal layer that may supplement the rigidity and transfer heat efficiently. The second member 36 may have rigidity greater than that of the first member 20. For example, the second member 36 may be made of stainless steel (SUS). The present disclosure is not limited to the material. The second member 36 may be referred to as a supporting metal layer, a rigid member, or a SUS layer, etc. The present disclosure is not limited to the terminology.

A first heat-dissipation layer 35 may be additionally disposed at an upper portion of the second member 36 to improve the heat dissipation efficiency. The first heat-dissipation layer 35 may dissipate the heat generated from the display panel 10 toward the rear surface RS of display apparatus 1. For example, the first heat-dissipation layer 35 may have a higher thermal conductivity than that of the second member 36.

The first heat-dissipation layer 35 may be embodied as a porous metal structure including a metal as a main component. The plurality of pores may be present inside the first heat-dissipation layer 35. Accordingly, the first heat-dissipation layer 35 may obtain a higher heat dissipation efficiency than that of the metal of the second member 36. For example, the first heat-dissipation layer 35 may be formed by sintering a metal foam precursor including metal powders. However, the present disclosure is not limited thereto.

The metal powders may include at least one metal powders selected from a group consisting of copper powders, nickel powders, iron powders, SUS powders, molybdenum powders, silver powders, platinum powders, gold powders, aluminum powders, chromium powders, indium powders, tin powders, magnesium powders, phosphorus powders, zinc powders, and manganese powders, or mixtures thereof, or allow powders of one or more metals. The present disclosure is not limited thereto.

The first heat-dissipation layer 35 according to an aspect of the present disclosure may be formed by injecting a metal powder slurry into a mold having a predetermined shape and sintering the slurry. The first heat-dissipation layer 35 may be composed of a metal film having flexibility. However, the present disclosure is not limited to the method.

The first heat-dissipation layer 35 may be made of a metal having multi-pores. For example, the first heat-dissipation layer 35 may be referred to as a metal foam, or a flexible conductive film (FCF), etc. The present disclosure is not limited to the terminology. A material of the first heat-dissipation layer 35 may include a metal. For example, the first heat-dissipation layer 35 may be made of copper (Cu) which has high thermal conductivity and may have the multi-pores.

Since the first heat-dissipation layer 35 is made of a metal having the multi-pores, the layer 35 may have a lighter weight than that of the same metal free of the pores. Since the metal has a soft property, workability such as cutting or bending thereof may be good. Further, since the first heat-dissipation layer 35 has the multi-pores, a surface area thereof in contact with air may be increased, and thus the layer 35 may have excellent heat dissipation ability.

In order to compensate for the soft property of the first heat-dissipation layer 35, for example, to supplement the rigidity thereof, the second member 36 may be disposed below the first heat-dissipation layer 35. The second member 36 may additionally supplement the rigidity of the display panel 10 as secured by the first member 20.

With reference to FIG. 2, the heat-dissipating structure 30 absorbs heat generated from the display panel 10 and dissipates the heat, thereby improving the heat-dissipation performance of the display apparatus 1. For example, the first heat-dissipation layer 35 absorbs the heat generated from the display panel 10, and dissipates the heat through an upper surface of the first heat-dissipation layer 35. For efficient heat transfer, the first heat-dissipation layer 35 may be made of a metal having multi-pores. In order to further supplement the rigidity of the first heat-dissipation layer 35, the second member 36 as a metal layer may be interposed between the first heat-dissipation layer 35 and the first adhesive layer 31, thereby simultaneously improving the rigidity and the heat-dissipation performance without increasing the thickness of the apparatus.

In one aspect of the present disclosure, the heat-dissipating structure 30 may be formed to have a size smaller than a size of each of the display panel 10 and the first member 20. When the heat-dissipating structure 30 is formed to be larger than the display panel 10, the non-display area may be increased. Accordingly, the heat-dissipating structure 30 may be formed to have the size smaller than the size of the first member 20 so as not to increase the non-display area. In one example, when the heat-dissipating structure 30 is smaller than the first member 20, a weight of the display apparatus 1 may be reduced and a manufacturing cost thereof may be reduced, but the heat-dissipation ability and impact absorption ability may be lowered.

Further, when the heat-dissipating structure 30 is smaller than the first member 20, a step occurs between the heat-dissipating structure 30 and the first member 20. Thus, in a one end area of the display panel 10 where the step is formed, the display panel 10 protrudes while the heat-dissipating structure 30 is not supported. Thus, a portion of the display panel in the other end area may be easily damaged when an external impact is applied thereto.

Accordingly, the display apparatus 1 according to one aspect of the present disclosure may be constructed so that a one end E1 of the heat-dissipating structure 30 coincides with a one end of each of the display panel 10 and the first member 20. For example, the other ends E1 of the display panel 10, the first member 20, and the heat-dissipating structure 30 may be aligned with each other without a step.

In order that the other ends E1 of the display panel 10, the first member 20 and the heat-dissipating structure 30 are aligned with each other without the step, the display panel 10, the first member 20 and the heat-dissipating structure 30 have the same area or size.

In one example, when the display panel 10, the first member 20, and the heat-dissipating structure 30 are adhered to each other such that the other ends E1 of the display panel 10, the first member 20, and the heat-dissipating structure 30 are aligned with each other without the step, it is difficult to form the display apparatus 1 to be achieved so that a size thereof has exactly a target size. Accordingly, the display apparatus 1 is first formed to have a size larger than the target size, and then the display apparatus 1 is cut using a laser apparatus to form the display apparatus 1 having the target size to be achieved. For example, the display apparatus 1 may be first formed to have a size B larger than a target size A to be achieved.

In order to form the display apparatus 1 of the target size A, a scheme of cutting a portion of the display apparatus 1 inwardly from a one end of the display apparatus 1 using a laser apparatus L may be used.

Figure 3:
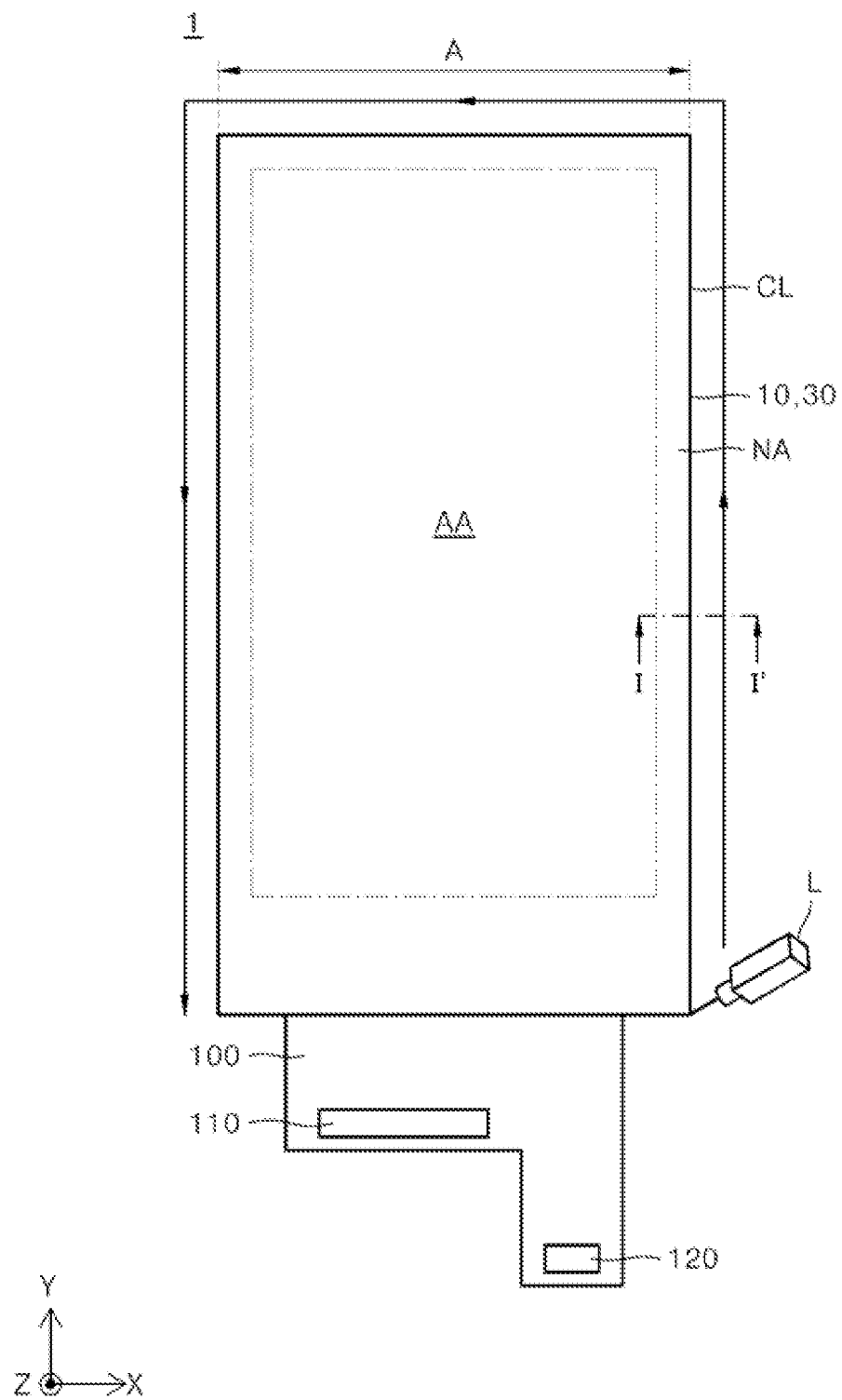
FIG. 3 illustrates a plan view of a method for performing laser trimming on the display apparatus of FIG. 1.
Figure 4:
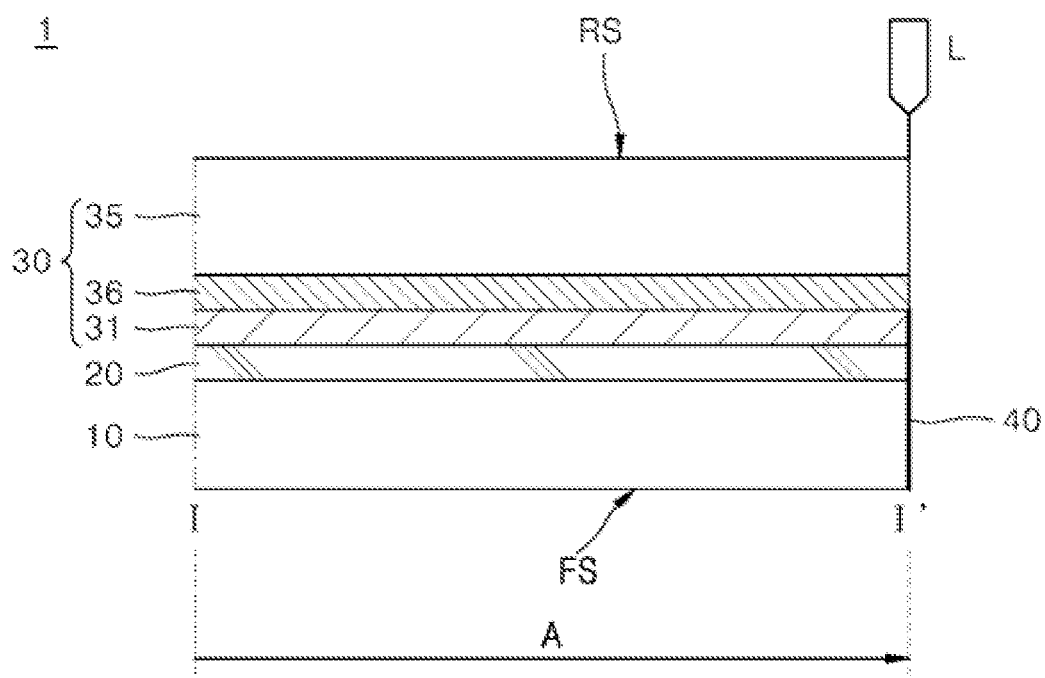
FIG. 4 is a cross-sectional view taken along cutting line I-I' of FIG. 3.

FIG. 3 is a plan view for illustrating a method for performing laser trimming on the display apparatus of FIG. 1, and FIG. 4 is a cross-sectional view taken along cutting line I-I' of FIG. 3.

With reference to FIG. 3, in order that the other ends E1 of the display panel 10, the first member 20 and the heat-dissipating structure 30 are aligned with each other without the step, the display panel 10, the first member 20 and the heat-dissipating structure 30 have the same area or size. With reference to FIG. 4, the display apparatus 1 according to another aspect of the present disclosure may include the display panel 10, the first member 20, the first adhesive layer 31, the second member 36, the first heat-dissipation layer 35, and an extension (or an extension part) 40 extending the first heat-dissipation layer 35 so as to cover a side (or lateral) surface of the display panel 10. Hereinafter, the same or similar components as in FIG. 2 will be briefly described.

With reference to FIG. 3, the laser apparatus L may cut the display apparatus 1 by irradiating a laser beam along a cutting line CL1 of the display apparatus 1 in an arrow direction in FIG. 3. The cutting line CL1 may be formed along three sides of the display apparatus 1. For example, the cutting line CL1 may be formed along an upper side, a left side, and a right side of the display apparatus 1.

In this regard, since the circuit board 100 including the driver integrated circuit 110 and the connector 120 is disposed at a lower side of the display apparatus 1, it may be difficult to cut the lower side thereof using the laser. Accordingly, the cutting line CL1 may be formed except for the lower side of the display apparatus 1. In this regard, the cutting line CL1 may overlap an area corresponding to the target size A to be achieved. The connector 120 may be embodied as a current connector.

The laser apparatus L may irradiate the laser beam in a straight line in a direction from the rear surface RS of the display apparatus 1 composed of the heat-dissipating structure 30 to a front surface FS thereof composed of the display panel 10. Then, the display apparatus 1 in which the heat-dissipating structure 30, the first member 20, and the display panel 10 are stacked vertically may be cut at once with the laser so that the side (or lateral) surfaces of the heat-dissipating structure 30, the first member 20, and the display panel 10 may be aligned with each other.

The cutting method using the laser apparatus L may be performed in a scheme of repeatedly irradiating an ultra-short pulse laser beam having a pulse duration in a femto-second range onto the heat-dissipating structure 30 of the display apparatus 1. When the ultra-short pulse laser beam is repeatedly irradiated thereon, a material constituting the heat-dissipating structure 30 to which the laser beam is irradiated may be melted. According to an aspect, for a period in which the laser pulse is continuously applied, the laser beam may be irradiated in an overlapping manner with the cutting line CL1 as a target point. Therefore, the cutting line CL1 irradiated with the laser pulse has a high temperature. When a subsequent laser pulse reaches the cutting line having the high temperature, a temperature of the cutting line exceeds a melting point of a material constituting the heat-dissipating structure 30, and melting thereof may start.

When the display apparatus 1 operates, charges are not uniformly distributed throughout the display apparatus 1 such that fixed charges may accumulate at specific locations. When the charges do not move and accumulate at the specific locations, the charges may flow into the display panel 10, thereby inducing an image quality defect when the display apparatus 1 subsequently operates. For example, a defect in which the organic light-emitting element emits green light at a poor amount may occur, resulting in deterioration of image quality. Since this defect affects reliability of the display apparatus, the inventors of the present disclosure have invented a grounding structure that may prevent this defect.

In this regard, in the process of cutting the heat-dissipating structure 30, the first member 20, and the display panel 10 using the cutting method using the laser apparatus L, a conductive thin-film (or the extension part) 40 of the display apparatus 1 may be formed as shown in FIG. 4.

The first heat-dissipation layer 35 among constituent materials of the molten heat-dissipating structure 30 may flow down toward the display panel 10. However, as the cutting line CL1 irradiated with the laser beam overlaps an area corresponding to the target size A to be achieved, the melting occurs in a side end portion of the first heat-dissipation layer 35. In other words, an area of a melted portion is narrow. Accordingly, the conductive thin-film or the extension 40 made of the material flowing down from the side end portion of the heat-dissipation layer 35 may be formed.

The extension 40 extends from the first heat-dissipation layer 35 so as to cover the side (or lateral) surface of the display panel 10. Since the extension 40 is made of the metal of the first heat-dissipation layer 35, the extension 40 may function as a conductive grounding wire. The extension 40 may prevent electric charges or fixed electric charges from flowing into the display panel 10. This may prevent the image quality defect caused by the electric charges or fixed charges generated when the display apparatus 1 operates, thereby improving the reliability of the display apparatus 1.

In the process of machining the heat-dissipation structure 30, the first member 20, and the display panel 10 via the cutting method using the laser apparatus L, melting occurs in an order of the first heat-dissipation layer 35, the second member 36, the first adhesive layer 31, the first member 20, and the display panel 10. The first heat-dissipation layer 35 has the porous metal structure, and the first heat-dissipation layer 35 has a large number of pores therein, such that melting thereof occurs at a relatively low temperature.

Since the second member 36 may be made of the metal to supplement the rigidity of the first heat-dissipation layer 35, the second member 36 has a higher melting temperature than that of the first heat-dissipation layer 35. For example, in order that a temperature obtained via the laser beam irradiation using the laser apparatus L exceeds the melting point of the second member 36, a laser beam irradiation time duration may be increased. When the irradiation time duration of the laser beam is increased, thermal energy transferred to the second member 36 is also transferred to the structure above and/or below the second member 36. This may cause thermal damage which may lead to a defect in the display apparatus 1. For example, the thermal energy transferred to the second member 36 via the laser beam irradiation may exceed the thermal energy required for melting the first heat-dissipation layer 35 above the second member 36 or the first adhesive layer 31, the first member 20, and the display panel below the second member 36, which in turn may be subject to thermal deformation or thermal damage.

Accordingly, the inventors of the present disclosure reduce the thermal energy required for melting of the second member 36 via the laser beam irradiation, thereby providing a display apparatus in which thermal deformation of or thermal damage to the structure above and/or below the second member 36 is reduced.

Figure 5:
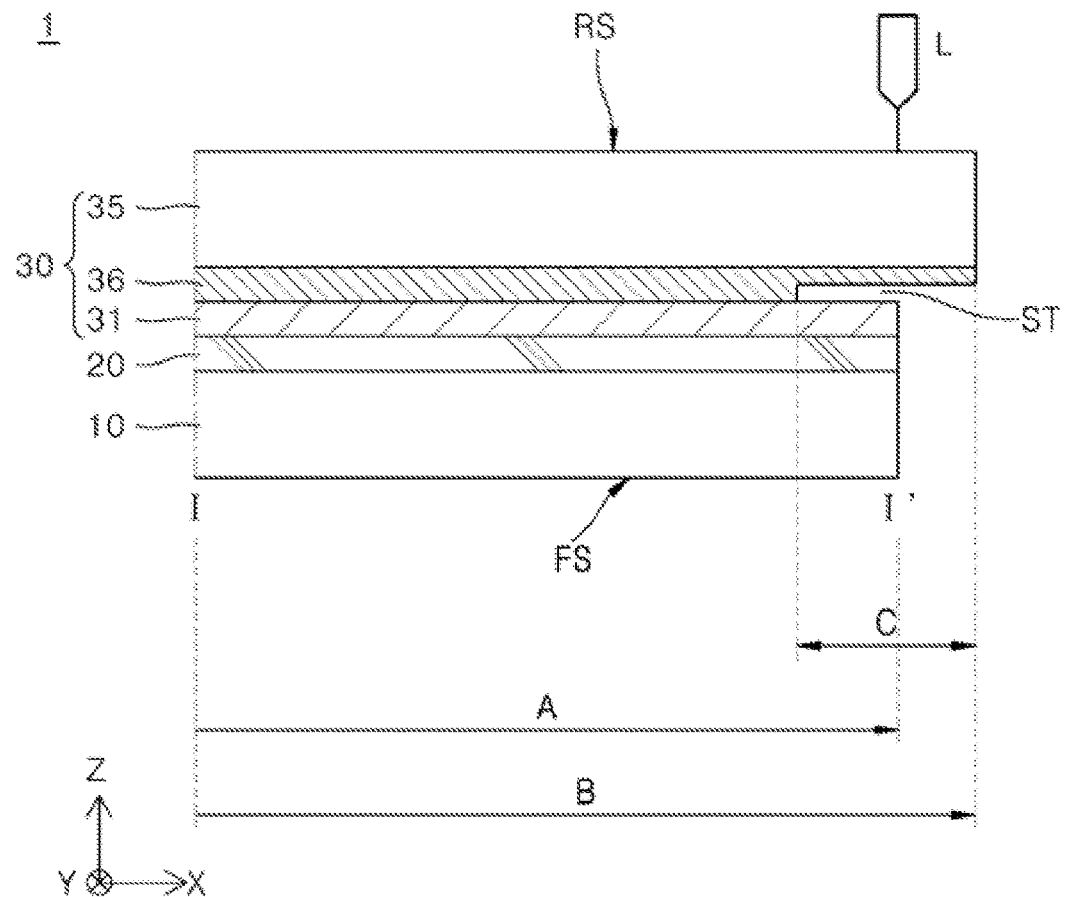
FIG. 5 is a cross-sectional view taken along cutting line I-I' of FIG. 3 according to another aspect of the present disclosure.
Figure 6:
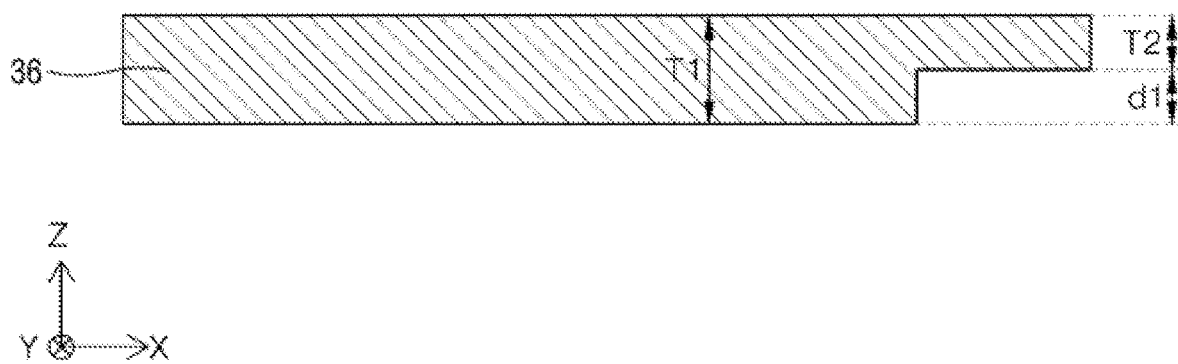
FIG. 6 is an enlarged cross-sectional view of a second member of FIG. 5.

FIG. 5 is a cross-sectional view taken along cutting line I-I' of FIG. 3 according to still another aspect of the present disclosure, and FIG. 6 is an enlarged cross-sectional view of a second member of FIG. 5.

With reference to FIG. 5, the display apparatus 1 according to still another aspect of the present disclosure may include the display panel 10, the first member 20, the first adhesive layer 31, the second member 36, and the first heat-dissipation layer 35. Hereinafter, the same or similar components as or to those in FIG. 4 will be briefly described.

The display panel 10 may include the display substrate, and may include the display area AA that displays an image and the non-display area NAA.

The first member 20 may be disposed at an upper portion (or upper side) of the display panel 10. The first member 20 may be disposed at a bottom (or lower) surface of the display substrate constituting the display panel 10 and may supplement the rigidity of the display substrate.

The first adhesive layer 31 may be disposed at an upper portion (or upper side) of the first member 20. The first adhesive layer 31 constitutes the heat-dissipating structure 35, and may adhere the first rigid member 20 and the first heat-dissipation layer 35 to each other.

The second member 36 may be disposed at an upper portion (or upper side) of the first adhesive layer 31. The first heat-dissipation layer 35 may be disposed at an upper portion (or upper side) of the second member 36. The second member 36 may supplement the rigidity of the first heat-dissipation layer 35, and may absorb the heat generated from the display panel 10 and transfer the heat to the first heat-dissipation layer 35. The first heat-dissipation layer 35 may dissipate the heat generated from display panel 10 toward the rear surface RS of display apparatus 1. Accordingly, the heat dissipation efficiency of the display apparatus 1 may be improved.

With reference to FIGS. 3 and 5, the laser apparatus L may irradiate the laser beam in a straight line in a direction from the rear surface RS of the display apparatus 1 composed of the heat-dissipating structure 30 to a front surface FS thereof composed of the display panel 10. Then, the display apparatus 1 in which the first heat-dissipation layer 35, the second member 36, the first adhesive layer 31, the first member 20, and the display panel 10 are stacked vertically may be cut at once with the laser so that the side (or lateral) surfaces of the first heat-dissipation layer 35, the second member 36, the first adhesive layer 31, the first member 20, and the display panel 10 may be aligned with each other.

The second member 36 may be embodied as a metal layer that may supplement the rigidity and transfer heat efficiently. Cutting via irradiation of the laser beam requires instantaneous thermal energy resulting from the irradiation of the laser beam. A total amount of thermal energy may be proportional to the irradiation time duration of the laser beam. Since the second member 36 has rigidity greater than that of the first heat-dissipation layer 35, cutting of the second member 36 via the laser beam irradiation requires greater thermal energy than that which cutting of the first heat-dissipation layer 35 requires. Due to the greater thermal energy required for cutting the second member 36, thermal deformation of or thermal damage to the structure above and/or below the second member 36 may occur.

With reference to FIG. 5, the second member 36 may include a first area as an inner area of the second member 36, and a second area C extending along and at an outer edge of each of at least three sides of the second member 36. A vertical dimension, a thickness, or a shape of the first area may be different from that of the second area C.

The second area C may extend along and at a left outer edge, an upper outer edge and a right outer edge of the second member 36. One side (or one end) of the target size A to be achieved by irradiating the laser beam, for example, the cutting line CL may be disposed in the second area C of the second member 36. A width of the second area C may be determined based on a process tolerance of an area to which the laser beam of the laser apparatus L is irradiated.

In the second area C, the second member 36 may be formed to be recessed inwardly from the bottom (or lower) surface of the second member 36. For example, the second area C may include a step area ST.

With reference to FIG. 6, a thickness of the second member 36 may have a value of T1 in the first area, and a value of T2 in the second area C. The value of T1 may be greater than the value of T2. A depth or a vertical dimension of the step may be equal to a d1 value which is a difference between the T1 value and the T2 value.

The first heat-dissipation layer 35 and the second member 36 are sequentially cut along the cutting line CL via the laser beam irradiation. Since the second member 36 has rigidity greater than that of the first heat-dissipation layer 35, cutting of the second member 36 via the laser beam irradiation requires greater thermal energy than that which cutting of the first heat-dissipation layer 35 requires. Due to the greater thermal energy required for cutting the second member 36, thermal deformation of or thermal damage to the structure above and/or below the second member 36 may occur.

In this regard, when the value of the thickness T2 of the second area C where the cutting of the second member 36 occurs is smaller than the value of the thickness T1 of the first area, the thermal energy required for cutting the second member 36 via the laser beam irradiation may be reduced. For example, the time duration for irradiating the laser beam may be shortened, thereby preventing the thermal damage to the structure above and/or below the second member 36. The laser beam irradiation time duration may be set based on a value of the thickness of the second member in the second area C, for example, the depth of the step.

The first heat-dissipation layer 35 among constituent materials of the molten heat-dissipating structure 30 may flow down toward the display panel 10. However, as the cutting line CL1 irradiated with the laser beam overlaps an area corresponding to the target size A to be achieved, the melting occurs in a side end portion of the first heat-dissipation layer 35. In other words, an area of a melted portion is narrow. Accordingly, the conductive thin-film or the extension 40 made of the material flowing down from the side end portion of the heat-dissipation layer 35 may be formed.

With reference to FIG. 4, the extension 40 extends from the first heat-dissipation layer 35 so as to cover the side (or lateral) surface of the display panel 10. Since the extension 40 is formed of the metal of the first heat-dissipation layer 35, the extension 40 may function as a conductive grounding wire. The extension 40 may prevent electric charges or fixed electric charges from flowing into the display panel 10. This may prevent the image quality defect caused by the electric charges or fixed charges generated when the display apparatus 1 operates, thereby improving the reliability of the display apparatus 1.

Further, the extension 40 extends from the first heat-dissipation layer 35 to the side surface of the display panel 10 so as to cover the side surfaces of the second member 36, the first adhesive layer 31, the first member 20, and the display panel 10. Accordingly, rigidity at the side surface of the display apparatus 1 may be supplemented. For example, the extension 40 may absorb the impact generated at the side surface of the display apparatus 1. Thus, the reliability of the display apparatus 1 may be improved.

Figure 7:
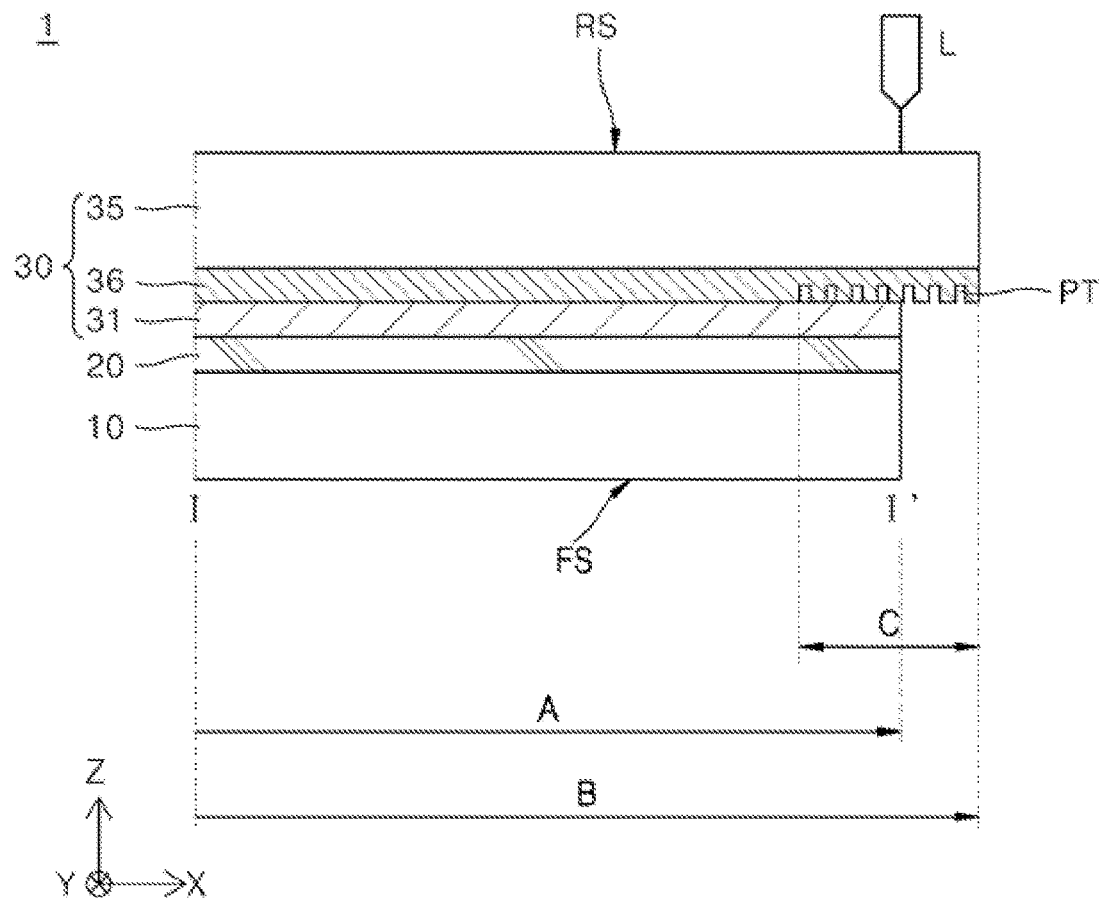
FIG. 7 is a cross-sectional view taken along cutting line I-I' of FIG. 3 according to still another aspect of the present disclosure.
Figure 8:
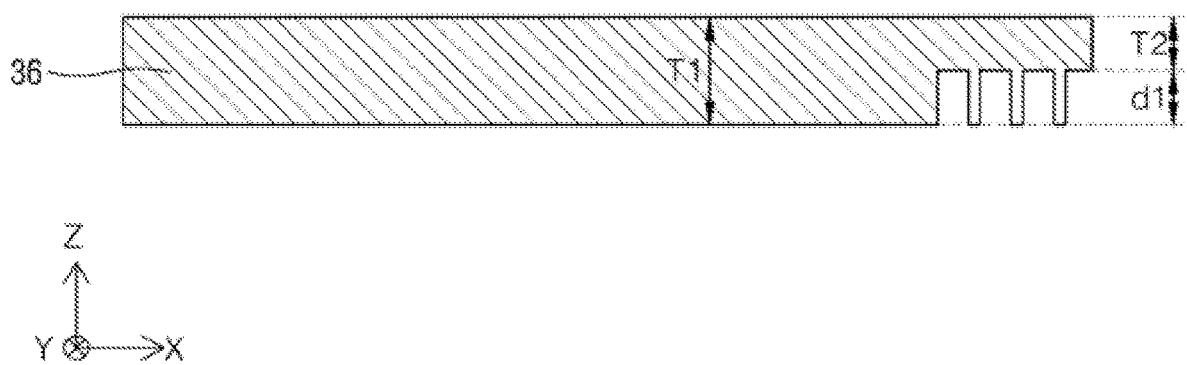
FIG. 8 is an enlarged cross-sectional view of a second member of FIG. 7.

FIG. 7 is a cross-sectional view taken along cutting line I-I' of FIG. 3 according to still yet another aspect of the present disclosure, and FIG. 8 is an enlarged cross-sectional view of a second member of FIG. 7.

With reference to FIG. 7, the display apparatus 1 according to still another aspect of the present disclosure may include the display panel 10, the first member 20, the first adhesive layer 31, the second member 36, and the first heat-dissipation layer 35. Hereinafter, the same or similar components as or to those in FIG. 4 will be briefly described.

The display panel 10 may include the display substrate, and may include the display area AA that displays an image and the non-display area NAA.

The first member 20 may be disposed at an upper portion (or upper side) of the display panel 10. The first member 20 may be disposed on a bottom (or lower) surface of the display substrate constituting the display panel 10 and may supplement the rigidity of the display substrate.

The first adhesive layer 31 may be disposed at an upper portion (or upper side) of the first member 20. The first adhesive layer 31 constitutes the heat-dissipating structure 35, and may adhere the first rigid member 20 and the first heat-dissipation layer 35 to each other.

The second member 36 may be disposed at an upper portion (or upper side) side of the first adhesive layer 31. The first heat-dissipation layer 35 may be disposed at an upper portion (or upper side) of the second member 36. The second member 36 may supplement the rigidity of the first heat-dissipation layer 35, and may absorb the heat generated from the display panel 10 and transfer the heat to the first heat-dissipation layer 35. The first heat-dissipation layer 35 may dissipate the heat generated from display panel 10 toward the rear surface RS of display apparatus 1. Accordingly, the heat dissipation efficiency of the display apparatus 1 may be improved.

With reference to FIGS. 3 and 7, the laser apparatus L may irradiate the laser beam in a straight line in a direction from the rear surface RS of the display apparatus 1 composed of the heat-dissipating structure 30 to a front surface FS thereof composed of the display panel 10. Then, the display apparatus 1 in which the first heat-dissipation layer 35, the second member 36, the first adhesive layer 31, the first member 20, and the display panel 10 are stacked vertically may be cut at once with the laser so that the side (or lateral) surfaces of the first heat-dissipation layer 35, the second member 36, the first adhesive layer 31, the first member 20, and the display panel 10 may be aligned with each other.

The second member 36 may be embodied as a metal layer that may supplement the rigidity and transfer heat efficiently. Cutting via irradiation of the laser beam requires instantaneous thermal energy resulting from the irradiation of the laser beam. A total amount of thermal energy may be proportional to the irradiation time duration of the laser beam. Since the second member 36 has rigidity greater than that of the first heat-dissipation layer 35, cutting of the second member 36 via the laser beam irradiation requires greater thermal energy than that which cutting of the first heat-dissipation layer 35 requires. Due to the greater thermal energy required for cutting the second member 36, thermal deformation of or thermal damage to the structure above and/or below the second member 36 may occur.

With reference to FIG. 7, the second member 36 may include a first area as an inner area of the second member 36, and a second area C extending along and at an outer edge of each of at least three sides of the second member 36. A vertical dimension, a thickness, or a shape of the first area may be different from that of the second area C.

The second area C may extend along and at a left outer edge, an upper outer edge and a right outer edge of the second member 36. One side (or one end) of the target size A to be achieved by irradiating the laser beam, for example, the cutting line CL may be disposed in the second area C of the second member 36. A width of the second area C may be determined based on a process tolerance of an area to which the laser beam of the laser apparatus L is irradiated.

An unevenness-shaped pattern (or a groove pattern) may be formed in the second member 36 and in the second area C. For example, the second area C may include a pattern area PT. The pattern of the second area C may extend along an outer edge of the second member 36. For example, the pattern of the second area C may be embodied as a groove pattern in which a valley extends in an elongate manner. The unevenness shape may be a rectangle, a triangle, or a circle. The present disclosure is not limited thereto. A depth of the valley or the groove of the unevenness shape may be, for example, smaller than a thickness of the second member 36 in the first area.

With reference to FIG. 8, the thickness of the second member 36 may have a value of T1 in the first area and may have a value of T2 in the second area C in which the valley or the groove of the unevenness pattern is formed. The value of T1 may be greater than the value of T2. The depth or the vertical dimension of the valley or the groove of the unevenness pattern in the second area C may be equal to a d1 value as a difference between the T1 value and the T2 value.

The first heat-dissipation layer 35 and the second member 36 are sequentially cut along the cutting line CL via the laser beam irradiation. Since the second member 36 has rigidity greater than that of the first heat-dissipation layer 35, cutting of the second member 36 via the laser beam irradiation requires greater thermal energy than that which cutting of the first heat-dissipation layer 35 requires. Due to the greater thermal energy required for cutting the second member 36, thermal deformation of or thermal damage to the structure above and/or below the second member 36 may occur.

In this regard, when the unevenness pattern is formed in the second member 36 and in the second area C where cutting of the second member 36 occurs, the thickness T2 of the second member in the second area C to be smaller than the value T1 of the thickness of the second member in the first area. Thus, the thermal energy required for cutting the second member 36 via the laser beam irradiation may be reduced. For example, the time duration for irradiating the laser beam may be shortened, thereby preventing the thermal damage to the structure above and/or below the second member 36. The laser beam irradiation time duration may be set based on a value of the thickness of the second member in the second area C, for example, the depth or the vertical dimension of the valley or the groove of the unevenness pattern.

The first heat-dissipation layer 35 among constituent materials of the molten heat-dissipating structure 30 may flow down toward the display panel 10. However, as the cutting line CL1 irradiated with the laser beam overlaps an area corresponding to the target size A to be achieved, melting occurs in a side end portion of the first heat-dissipation layer 35. In other words, an area of a melted portion is narrow. Accordingly, the conductive thin-film or the extension 40 made of the material flowing down from the side end portion of the heat-dissipation layer 35 may be formed.

With reference to FIG. 4, the extension 40 extends from the first heat-dissipation layer 35 so as to cover the side surface of the display panel 10. Since the extension 40 is made of the metal of the first heat-dissipation layer 35, the extension 40 may function as a conductive grounding wire. The extension 40 may prevent electric charges or fixed electric charges from flowing into the display panel 10. This may prevent the image quality defect caused by the electric charges or fixed charges generated when the display apparatus 1 operates, thereby improving the reliability of the display apparatus 1.

Further, the extension 40 extends from the first heat-dissipation layer 35 to the side surface of the display panel 10 so as to cover the side surfaces of the second member 36, the first adhesive layer 31, the first member 20, and the display panel 10. Accordingly, rigidity at the side surface of the display apparatus 1 may be supplemented. For example, the extension 40 may absorb the impact generated at the side surface of the display apparatus 1. Thus, the reliability of the display apparatus 1 may be improved.

A display apparatus according to an aspect of the present disclosure may be described as follows.

The display apparatus according to an aspect of the present disclosure comprises, a display panel configured to display an image from one surface of the display panel; a first member disposed at another surface of the display panel; a first adhesive layer disposed at an upper portion of the first member; a second member disposed at an upper portion of the first adhesive layer; and a first heat-dissipation layer disposed at an upper portion of the second member, wherein the second member includes a first area including a central area of the second member, and a second area including at least three outer edges of the second member, wherein the second member has a vertical dimension or a shape of the second member in the first area is different from a vertical dimension or a shape of the second member in the second area.

According to some aspect of the present disclosure, the second member in the second area may be recessed inwardly from a lower surface of the second member.

According to some aspect of the present disclosure, the vertical dimension of the second member in the first area may be larger than the vertical dimension of the second member in the second area.

According to some aspect of the present disclosure, the second member in the second area may include a pattern, and the pattern having an unevenness shape.

According to some aspect of the present disclosure, the pattern in the second area may extend along the at least three outer edges of the second member and the pattern includes a groove, and wherein the vertical dimension of the second member in the first area is larger than the vertical dimension of the groove.

According to some aspect of the present disclosure, the first heat-dissipation layer may have a plurality of pores therein, and be formed of copper.

According to some aspect of the present disclosure, the second member may have rigidity greater than rigidity of the first member, and include a metal.

According to some aspect of the present disclosure, the second member may have rigidity greater than rigidity of the first heat-dissipation layer, and include a metal.

According to some aspect of the present disclosure, the apparatus may further comprise an extension part extending from the first heat-dissipation layer and covering a side surface of the display panel.

According to some aspect of the present disclosure, the at least three outer edges may include a left side edge, an upper side edge, and a right side edge of the second member.

According to another aspect of the present disclosure, a display apparatus comprises, a display panel configured to display an image from one surface thereof; a first member disposed on another surface of the display panel; a first adhesive layer disposed at an upper portion of the first member; a second member disposed at an upper portion of the first adhesive layer; and a first heat-dissipation layer disposed at an upper portion of the second member, wherein the first heat-dissipation layer is porous and includes copper, wherein the second member includes a first area including a central area of the second member, and a second area including an outer edge of the second member, wherein a thickness and a shape of the second member in the first area are different from a thickness and a shape of the second member in the second area, wherein the second member has rigidity greater than rigidity of the first heat-dissipation layer, and includes a metal.

According to some aspect of the present disclosure, the thickness of the second member in the second area may be smaller than the thickness of the second member in the first area.

According to some aspect of the present disclosure, the second member in the second area may be recessed inwardly in the second member.

According to some aspect of the present disclosure, the second member may have a groove pattern in the second area, wherein the groove pattern has a groove extending along the outer edge.

According to some aspect of the present disclosure, the apparatus may further comprise an extension part extending from the first heat-dissipation layer and covering a side surface of the display panel.

It will be apparent to those skilled in the art that various modifications and variations can be made in the present disclosure without departing from the technical idea or scope of the disclosures. Thus, it is intended that the present disclosure covers the modifications and variations of this disclosure provided they come within the scope of the appended claims and their equivalents.

What is claimed is:

1. A display apparatus, comprising:
    a display panel configured to display an image from one surface of the display panel;
    a first member disposed at another surface of the display panel;
    a first adhesive layer disposed at an upper portion of the first member;
    a second member disposed at an upper portion of the first adhesive layer; and
    a first heat-dissipation layer disposed at an upper portion of the second member,
    wherein the second member includes a first area including a central area of the second member, and a second area including at least three outer edges of the second member, and
    wherein the second member has a vertical dimension or a shape in the first area different from a vertical dimension or a shape of the second member in the second area.

2. The display apparatus of claim 1, wherein the second member in the second area is recessed inwardly from a lower surface of the second member.

3. The display apparatus of claim 2, wherein the vertical dimension of the second member in the first area is larger than the vertical dimension of the second member in the second area.

4. The display apparatus of claim 1, wherein the second member in the second area includes a pattern having an unevenness shape.

5. The display apparatus of claim 4, wherein the pattern in the second area extends along the at least three outer edges of the second member and the pattern includes a groove, and
    wherein the vertical dimension of the second member in the first area is larger than a vertical dimension of the groove.

6. The display apparatus of claim 1, wherein the first heat-dissipation layer has a plurality of pores therein and is formed of copper.

7. The display apparatus of claim 1, wherein the second member has rigidity greater than rigidity of the first member and includes a metal.

8. The display apparatus of claim 1, wherein the second member has rigidity greater than rigidity of the first heat-dissipation layer and includes a metal.

9. The display apparatus of claim 1, further comprising an extension part extending from the first heat-dissipation layer and covering a side surface of the display panel.

10. The display apparatus of claim 1, wherein the at least three outer edges include a left side edge, an upper side edge, and a right side edge of the second member.

11. A display apparatus, comprising:
    a display panel configured to display an image from one surface of the display panel;
    a first member disposed on another surface of the display panel;
    a first adhesive layer disposed at an upper portion of the first member;
    a second member disposed at an upper portion of the first adhesive layer; and
    a first heat-dissipation layer disposed at an upper portion of the second member, wherein the first heat-dissipation layer is porous and includes copper, wherein the second member includes a first area including a central area of the second member, and a second area including an outer edge of the second member, wherein a thickness and a shape of the second member in the first area are different from a thickness and a shape of the second member in the second area, wherein the second member has rigidity greater than rigidity of the first heat-dissipation layer, and includes a metal.

12. The display apparatus of claim 11, wherein the thickness of the second member in the second area is smaller than the thickness of the second member in the first area.

13. The display apparatus of claim 12, wherein the second member in the second area is recessed inwardly in the second member.

14. The display apparatus of claim 12, wherein the second member has a groove pattern in the second area, and wherein the groove pattern has a groove extending along the outer edge.

15. The display apparatus of claim 11, further comprising an extension part extending from the first heat-dissipation layer and covering a lateral surface of the display panel.

* * * * *